(12) United States Patent
Liu et al.

(10) Patent No.: US 7,542,303 B2
(45) Date of Patent: Jun. 2, 2009

(54) PRINTED CIRCUIT BOARD

(75) Inventors: Chien-Hung Liu, Taipei Hsien (TW);
Shou-Kuo Hsu, Taipei Hsien (TW);
Yu-Chang Pai, Taipei Hsien (TW)

(73) Assignee: Hon Hai Precision Industry Co., Ltd.,
Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/957,419

(22) Filed: Dec. 15, 2007

(65) Prior Publication Data

US 2009/0065241 A1 Mar. 12, 2009

(30) Foreign Application Priority Data

Sep. 6, 2007 (CN) .................. 2007 1 0201603

(51) Int. Cl.
*H05K 7/10* (2006.01)
*H05K 7/12* (2006.01)

(52) U.S. Cl. .................. 361/767; 361/792; 361/795

(58) Field of Classification Search .................. 361/775, 361/792–795; 174/255–257, 259; 333/4, 333/238, 246
See application file for complete search history.

(56) References Cited

U.S. PATENT DOCUMENTS

| | | | | |
|---|---|---|---|---|
| 5,966,056 A | * | 10/1999 | Thornton | 333/5 |
| 6,067,594 A | * | 5/2000 | Perino et al. | 710/301 |
| 6,924,712 B2 | * | 8/2005 | Tabatabai | 333/4 |
| 7,019,401 B2 | * | 3/2006 | Chang et al. | 257/758 |
| 7,045,719 B1 | * | 5/2006 | Alexander et al. | 174/262 |
| 7,196,906 B1 | * | 3/2007 | Alexander et al. | 361/760 |
| 7,231,618 B2 | * | 6/2007 | Huang et al. | 716/4 |
| 7,232,959 B2 | * | 6/2007 | Hsu | 174/261 |

* cited by examiner

*Primary Examiner*—Tuan T Dinh
(74) *Attorney, Agent, or Firm*—Frank R. Niranjan

(57) ABSTRACT

A printed circuit board (PCB) includes first and second signal layers sandwiching a dielectric layer therebetween, and a differential pair having two differential traces respectively disposed within the first and second signal layers. Two ground parts are respectively arranged at opposite sides of each of the two differential traces.

5 Claims, 2 Drawing Sheets

PRINTED CIRCUIT BOARD

BACKGROUND

1. Field of the Invention

The present invention relates to printed circuit boards (PCBs), and particularly to a PCB with reduced single-ended impedances of signal traces thereof.

2. Description of Related Art

Referring to FIG. 1, a partial cross-sectional view of a conventional PCB 1 is illustrated. As shown, the PCB 1 includes a differential pair 10 having a positive differential trace D+ and a negative differential trace D− respectively disposed within two signal layers in a broadside-coupling mode, and two ground layers 20 arranged above and below the differential pair 10 respectively. A preferred value of the differential impedance between the positive differential trace D+ and negative differential trace D− is approximately 100 ohms, and a preferred value of the single-ended impedance of either of the positive differential trace D+ and negative differential trace D− is approximately 50-60 ohms.

However, in this broadside-coupling mode of the conventional PCB 1, the single-ended impedance of either of the positive differential trace D+ and negative differential trace D− may be too much, thereby reducing transmission quality thereof. Furthermore, each conventional ground area is formed as an independent layer, which occupies lots of space of the PCB 1.

What is desired, therefore, is to provide a PCB which overcomes the above problems.

SUMMARY

An embodiment of a printed circuit board (PCB) includes first and second signal layers sandwiching a dielectric layer therebetween, and a differential pair having two differential traces respectively disposed within the first and second signal layers. Two ground parts are respectively arranged at opposite sides of each of the two differential traces.

BRIEF DESCRIPTION OF THE DRAWINGS

Other advantages and novel features of the present invention will become more apparent from the following detailed description of an embodiment when taken in conjunction with the accompanying drawings, in which.

DETAILED DESCRIPTION

Figure 1:
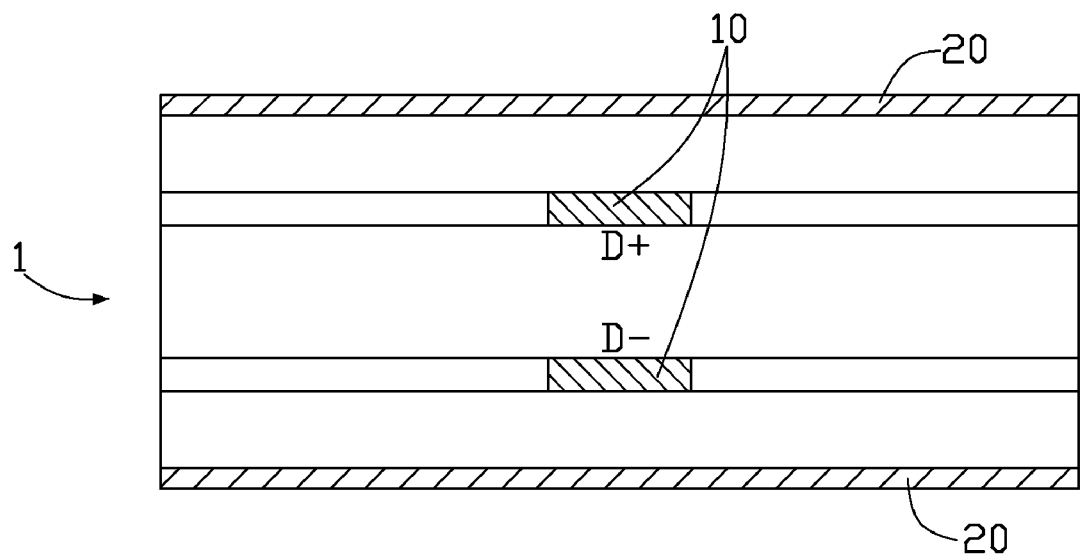
FIG. 1 is a partial cross-sectional view of a conventional PCB.
Figure 2:
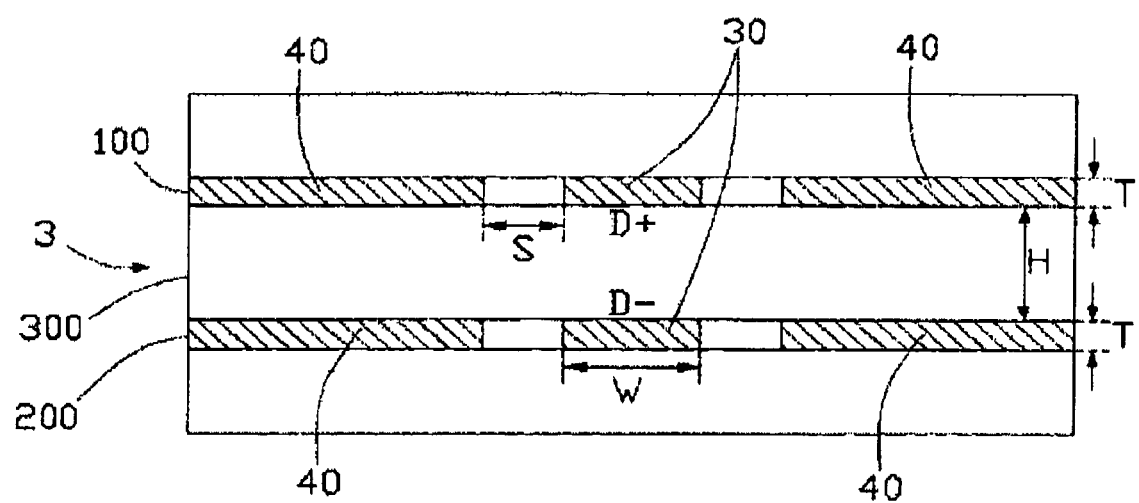
FIG. 2 is a partial cross-sectional view of a PCB in accordance with an embodiment of the present invention.

Referring to FIG. 2, a printed circuit board (PCB) 3 in accordance with an embodiment of the present invention includes a differential pair 30 having a positive differential trace D+ and a negative differential trace D− respectively disposed within a first signal layer 100 and a second signal layer 200 sandwiching a dielectric layer 300 therebetween, two ground parts 40 at the first signal layer 100 respectively arranged at opposite sides of the positive differential trace D+, and two ground parts 40 at the second signal layer 200 respectively arranged at opposite sides of the negative differential trace D−.

A single-ended impedance of a signal trace of the differential pair 30 can be calculated with this formula:

$$Z_0 \approx \frac{87}{\sqrt{\varepsilon_r + 1.41}} \ln \frac{5.98S}{0.8W + T}$$

Wherein, $Z_0$ is the single-ended impedance of the signal trace, $\varepsilon_r$ is the dielectric constant, W is the width of the signal trace, T is the thickness of the signal trace, S is the distance between the signal trace and the adjacent ground part 40. The single-ended impedance of the signal trace can be adjusted by changing the width W, the thickness T, and the distance S. However, the width W and the thickness T generally cannot be changed, thereby the single-ended impedance of the signal trace can be adjusted by changing the distance S.

In this embodiment, the widths W of the differential traces D+ and D− are both approximately 4 mils. The distance H between the differential traces D+ and D− is approximately 8 mils. The thicknesses T of the differential traces D+ and D− are both approximately 2.1 mils. The distances S between of the differential traces D+ and D− and the corresponding adjacent ground part 40 are both approximately 4.8 mils. Thereby the single-ended impedance of either of the differential traces D+ and D− is approximately 60.83, and the differential impedance between the positive differential trace D+ and negative differential trace D− is approximately 100.39 ohms, which are both close to the preferred values thereof.

Moreover, the ground parts 40 can reduce common-mode noise from the differential traces D+ and D−, and replace the conventional ground layers which saves space on the PCB 3.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A printed circuit board (PCB) comprising:

first and second signal layers sandwiching a dielectric layer therebetween; and a differential pair having a positive differential trace and a negative differential trace, the positive differential trace disposed within the first signal layer and the negative differential traced disposed within the second signal layers, wherein two ground parts are disposed in the first signal layer on opposite sides of the positive differential trace in the first signal layer, and two ground parts are disposed in the second signal layer on opposite sides of the negative differential trace in the second signal layer;

wherein a single-ended impedance of a differential trace of the differential pair is calculated with this formula:

$$Z_0 \approx \frac{87}{\sqrt{\varepsilon_r + 1.41}} \ln \frac{5.98S}{0.8W + T}$$

wherein, $Z_0$ is the single-ended impedance of the differential trace, $\varepsilon_r$ is the dielectric constant, W is the width of the differential trace, T is the thickness of the differential trace, S is the distance between the differential trace and the adjacent coplanar ground part, and wherein the widths of the positive and negative differential traces are both approximately 4 mils, the distance between the positive and negative differential traces is approximately 8 mils, the thicknesses of the positive and negative differential traces are both approximately 2.1 mils, the distances between each of the positive and negative differential traces and the corresponding adjacent coplanar ground part are both approximately 4.8 mils.

2. A multilayer printed circuit board comprising:

a first signal layer, a second signal layer, and a dielectric layer sandwiched between the first and second signal layers;

wherein the first signal layer is comprised of a positive differential trace of a differential pair, and two coplanar ground parts disposed e on opposite sides of the positive differential trace; and wherein the second signal layer is comprised of a negative differential trace of the differential pair, and two coplanar ground parts disposed on opposite sides of the negative differential trace;

wherein a single-ended impedance of a differential trace of the differential pair is calculated with this formula:

$$Z_0 \approx \frac{87}{\sqrt{\varepsilon_r + 1.41}} \ln \frac{5.98S}{0.8W + T}$$

wherein, $Z_0$ is the single-ended impedance of the differential trace, $\varepsilon_r$ is the dielectric constant, W is the width of the differential trace, T is the thickness of the differential trace, S is the distance between the differential trace and the adjacent coplanar ground part, and wherein the widths of the positive and negative differential traces are both approximately 4 mils, the distance between the positive and negative differential traces is approximately 8 mils, the thicknesses of the positive and negative differential traces are both approximately 2.1 mils, the distances between each of the positive and negative differential traces and the corresponding adjacent coplanar ground part are both approximately 4.8 mils.

3. The multilayer printed circuit board of claim 2, wherein the ground parts in the first signal layer are the reference ground of the positive differential trace, and the ground parts in the second signal layer are the reference ground of the negative differential trace.

4. The multilayer printed circuit board of claim 2, wherein the positive differential trace and the negative differential trace of the differential pair are in alignment with each other in a direction perpendicular to the first and second signal layers.

5. The multilayer printed circuit board of claim 4, wherein the ground parts at the same side of the positive and negative differential traces are in alignment with each other in the direction perpendicular to the first and second signal layers.

* * * * *